(12) United States Patent
Schulist et al.

(10) Patent No.: US 6,542,558 B1
(45) Date of Patent: Apr. 1, 2003

(54) OPTIMUM TURBO DECODING ARCHITECTURE AND METHOD USING A CONSTANT OR QUASI-CONSTANT SIGNAL-TO-NOISE RATIO

(75) Inventors: Matthias Schulist, Erlangen (DE); Dirk Gerstenberger, Kista (SE); Michael Marquardt, Nürnberg (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/322,169

(22) Filed: May 28, 1999

(51) Int. Cl.[7] ............................................. H04L 27/06
(52) U.S. Cl. ...................................... 375/340; 375/147
(58) Field of Search ............................... 375/340, 130, 375/147, 341, 346; 455/226.3

(56) References Cited

U.S. PATENT DOCUMENTS

| | | | |
|---|---|---|---|
| 5,479,477 A | | 12/1995 | Chow et al. |
| 6,252,917 B1 | * | 6/2001 | Freeman ..................... 375/340 |
| 6,373,823 B1 | * | 4/2002 | Chen et al. ................. 370/252 |
| 6,377,607 B1 | * | 4/2002 | Ling et al. .................. 375/130 |

FOREIGN PATENT DOCUMENTS

| | | |
|---|---|---|
| EP | 0715423 A1 | 5/1996 |
| EP | 0849887 A2 | 6/1998 |
| WO | 98/58461 | 12/1998 |
| WO | 99/05808 | 2/1999 |

OTHER PUBLICATIONS

Summers et al., "SNR Mismatch and Online Estimation in Turbo Decoding", IEEE Transactions on Communications, Apr. 1998, vol. 46, No. 4, pp. 421–423.*

A. Sampath et al., "On Setting Reverse Link Target Sir in a CDMA System", IEEE Vehicular Technology Conference, 1997, pp. 929–933.

"Near Shannon Limit Error—Correcting Coding and Decoding: Turbo–Codes", IEEE International Communication conference, pp. 1064–1070, May 1993.

"A Primer on Turbo Code Concepts", IEEE Communications Magazine, pp. 94–102, Dec. 1997.

"Optimal Decoding of Linear Codes for Minimizing Symbol Error Rate", IEEE Transactions on Information Theory, vol. 20, pp. 284–287, Mar. 1974.

"A Comparison of Optimal and Sub–Optimal MAP Decoding Algorithms Operating in the Log Domain", IEEE International Communication conference, pp. 1009–01013, 1995.

"Improved Decoding with the SOVA in a Parallel Concatenated (Turbo–code) Scheme", IEEE International Communications conference, pp. 102–106, 1996.

* cited by examiner

Primary Examiner—Stephen Chin
Assistant Examiner—David B. Lugo

(57) ABSTRACT

Use of a more accurate, constant or quasi-constant reference signal-to-noise ratio value to support the process of decoding information sequences that have been encoded using turbo coding techniques, particularly in UMTS WCDMA receivers, enhances the accuracy of the decoding process and, in turn, link quality and overall system performance. This may be accomplished by exploiting the reference SNR, which is generated, for example, by the power control loop in the receiver. More specifically, the present invention modifies this reference SNR value based on various factors including, but not limited to, the scaling factor that is applied to the decoder input metrics, power settings, processing gains, coding rates and/or the modulation scheme.

31 Claims, 4 Drawing Sheets

OPTIMUM TURBO DECODING ARCHITECTURE AND METHOD USING A CONSTANT OR QUASI-CONSTANT SIGNAL-TO-NOISE RATIO

FIELD OF INVENTION

The present invention relates to the field of telecommunications, and in particular, the field of wireless telecommunications. More specifically, the present invention relates to the decoding of telecommunication signals that, prior to transmission, were encoded using turbo coding or similar concatenated coding techniques.

BACKGROUND

Turbo codes are employed for the purpose of error control when transmitting telecommunications data. In general, turbo coding involves applying two or more component codes to different interleaved versions of the same information sequence prior to transmission. Consequently, decoding involves the use of separate decoders, wherein each of the separate decoders corresponds with one of the aforementioned two or more component codes. Since its introduction in 1993, turbo coding has become well-known in the art. A more detailed discussion of turbo coding can be found, for example, in Berrou et al., "Near Shannon Limit Error—Correcting Coding and Decoding: Turbo-Codes", IEEE International Communication conference, pp. 1064–1070, May 1993; and in Sklar, "A Primer on Turbo Code Concepts", IEEE Communications Magazine, pp. 94–102, December 1997.

As one skilled in the art will readily appreciate, decoding an information sequence that has been encoded in accordance with a turbo coding scheme is an iterative process. That is, each of the separate decoders is employed to estimate the a posteriori probability of the information bits associated with the information sequence, wherein extrinsic estimates (derived from the a posteriori information) produced by one decoder become part of the input information for the next decoder. The next decoder then updates the extrinsic estimates. One skilled in the art will also appreciate the fact that in order to achieve good channel (i.e. link) quality and, hence, good system performance, complex, iterative decoding techniques and decoder architectures are required. Such decoding techniques are embodied in, for example, the maximum a posteriori (MAP) algorithm, described more thoroughly in Bahl et al., "Optimal Decoding of linear Codes for Minimizing Symbol Error Rate", IEEE Transactions on Information Theory, vol. 20, pp. 284–287, March 1974; the Log-MAP algorithm, as described in Robertson et al., "A Comparison of Optimal and Sub-Optimal MAP Decoding Algorithms Operating in the Log Domain", IEEE International Communication conference, pp. 1009–1013, 1995; and the modified soft-input Viterbi algorithm (SOVA), as described in Papke et al., "Improved Decoding with the SOVA in a Parallel Concatenated (Turbo-code) Scheme", IEEE International Communication conference, pp. 102–106, 1996.

Optimal turbo decoding algorithms, such as those identified above, require knowledge of the channel signal-to-noise ratio (SNR), as stated in Summers et al., "SNR Mismatch and Online Estimation in Turbo Decoding", IEEE Transactions on Communications, vol. 46, no. 4, pp. 421–423, April 1998. These algorithms use SNR, or more specifically, estimated SNR, to produce accurate MAP estimates (i.e., a posteriori estimates) and to blend the a posteriori information associated with the separate decoders. Decoders such as soft-input, soft-output Viterbi decoders, which do not rely upon SNR, are considered suboptimal for turbo decoding purposes.

There are, of course, any number of conventional techniques for deriving an estimate of SNR. The drawbacks associated with such conventional techniques, particularly those employed to support turbo decoding, are the general lack of accuracy in and the variation of the SNR estimates. Although it is important to note that the optimal turbo decoding algorithms identified above tend to be more tolerant of channel SNR overestimations rather than channel SNR underestimations, the general lack of accuracy associated with conventional SNR estimation methods degrades link quality and, hence, system performance.

In order to more favorably exploit the capabilities that turbo coding offers, it would, therefore, be highly desirable to provide more accurate SNR estimations that exhibit little, if any, fluctuation in value to support the process of decoding information sequences that have been encoded using a turbo coding scheme.

SUMMARY OF THE INVENTION

The present invention involves the use of more accurate, constant SNR value to support the process of decoding information sequences that have been encoded using turbo coding techniques, particularly in UMTS WCDMA receivers. In general, the present invention provides more accurate, constant SNR value by exploiting the reference SNR that is generated by the power control loop in the receiver for the purpose of generating power control commands. More specifically, the present invention modifies the reference SNR, which is otherwise associated with the power control loop, based on various factors including, but not limited to, the scaling factor that is applied to the decoder input metrics, power settings, processing gains and coding rates.

Accordingly, it is an object of the present invention to provide a more accurate SNR value for turbo decoding purposes, in order to enhance link performance.

It is another object of the present invention to provide a constant, or quasi-constant SNR value for turbo decoding purposes, in order to enhance link performance.

It is yet another object of the present invention to provide a decoder implementation that is less complex.

In accordance with one aspect of the present invention, the above-identified and other objectives are achieved by a receiver, in a telecommunications system, that includes a demodulation unit capable of demodulating a received telecommunications signal and capable of producing scaled, decode input metrics. The receiver also includes a signal-to-noise ratio adaptation unit that is capable of modifying a constant or quasi-constant signal-to-noise value. In addition, the receiver includes a turbo decoder connected to the demodulation unit and the signal-to-noise adaptation unit, wherein said turbo decoder decodes the received signal as a function of the decode input metrics and the modified reference signal-to-noise value.

In accordance with another aspect of the present invention, the above-identified and other objectives are achieved by a wideband code division multiple access (WCDMA) receiver, designed to operate in accordance with a Universal Mobile Telecommunications System (UMTS). the WCDMA receiver includes a receive antenna for receiving a transmitted signal and a demodulation unit connected to the receive antenna, where the demodulation unit is capable of demodulating the received signal from the receive antenna and capable of generating therefrom scaled, decode input metrics. The WCDMA receiver also includes a power control loop connected to the receive antenna, where the power control loop is capable of generating transmit power control commands as a function of a reference signal-to-noise ratio and signal-to-noise ratio estimates which are generated as a function of the received signal. In addition, the receiver employs a signal-to-noise ratio adaptation unit, which is connected to the power control loop, where the signal-to-noise ratio adaptation unit receives and modifies the reference signal-to-noise ratio value. A turbo decoder connected to the demodulation unit and the signal-to-noise ratio adaptation unit then decodes the received signal as a function of the decode input metrics and the modified reference signal-to-noise ratio value.

In accordance with yet another aspect of the present invention, the above-identified and other objectives are achieved by a method for decoding a received signal that was encoded in accordance with a turbo coding scheme. the method involves demodulating the received signal and generating therefrom decode input metrics. The method further involves generating a reference signal-to-noise ratio value as a function of a desired link performance operating point, where the reference signal-to-noise ratio only changes if a different link performance operating point is desired. In addition, the method involves decoding the received signal as a function of the decode input metrics and the reference signal-to-noise ratio.

BRIEF DESCRIPTION OF THE FIGURES

The objectives and advantages of the present invention will be understood by reading the following detailed description in conjunction with the drawings, in which.

DETAILED DESCRIPTION OF THE INVENTION

Figure 1:
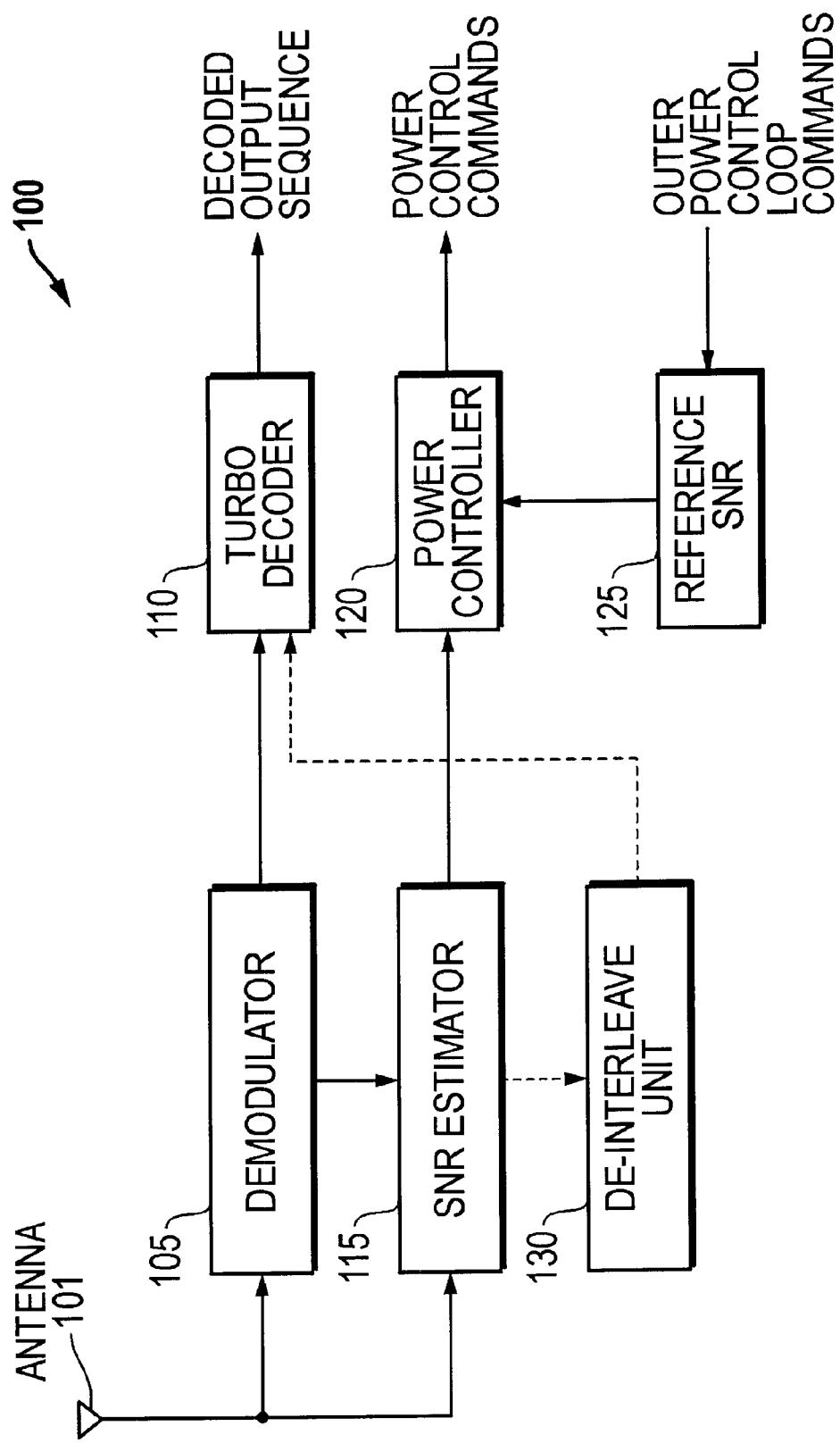
FIG. 1 illustrates the architecture associated with a conventional receiver, such as a UMTS WCDMA receiver.

FIG. 1 illustrates the architecture of a conventional Universal Mobile Telecommunications System (UMTS) Wideband Code Division Multiple Access (WCDMA) receiver 100 which has turbo decoding capabilities. As shown, the receiver 100 includes, among other components, a demodulation unit 105 and a turbo decoder 110. The receiver 100 also includes a power control loop comprising a signal-to-noise (SNR) estimator 115, a power controller 120 and a reference SNR module 125.

As indicated in FIG. 1, the received, turbo encoded signal is forwarded from the antenna 101 to both the demodulation unit 105 and the SNR estimator 115. The SNR estimator 115 then uses the received signal to derive interference measurements, which the SNR estimator 115 uses, in turn, along with power estimations received from the demodulation unit 105, to calculate SNR estimates for each power control interval, where data, in accordance with the UMTS standard, is typically transmitted in super-frames, each super-frame consisting of 72 radio frames that are 10 milliseconds in duration, and each radio frame consisting of 16 time slots, and wherein each time slot typically constitutes a power control interval. Accordingly, the SNR estimates produced by the SNR estimator 115 are said to be "fast" (i.e., short-term) estimates. These "fast", short-term SNR estimates are then forwarded to the power controller 120, which compares them to a reference SNR value generated by the reference SNR module 125. The reference SNR value, as one skilled in the art will readily appreciate, remains relatively constant, and it is set by outer power control loop commands based on a desired link performance level (e.g., a desired bit error rate). The power controller 120 then issues power control commands for the transmitter based on the results of this comparison. For instance, if the SNR estimates are somewhat less than the reference SNR, the power controller 120 may issue a command to increase the transmission power for a corresponding transport channel in order to achieve the desired link performance level.

While the power control loop utilizes the received signal to adjust transmission power levels, the demodulation unit 105, as the name suggests, demodulates the received signal and generates scaled, decoder input metrics, which are forwarded to the turbo decoder 110. However, as stated above, the turbo decoder 110, and more particularly, the turbo decoding algorithms contained therein, require accurate SNR values to accurately decode the received signal. In most conventional designs, though, the turbo decoder 110 relies on frame-based SNR estimates. That is, SNR estimates that are measured over the duration of a single radio frame. Like the time slot based SNR estimates generated by the SNR estimator 115, the frame-based SNR estimates are also considered "fast", relatively short-term estimates. The problem, of course, is that "fast", short-term SNR estimates are generally inaccurate and fluctuate substantially, and reliance on inaccurate SNR estimates tends to increase the error rates associated with the decoded signal. Thus, link quality is compromised and overall system performance is degraded.

Alternatively, the turbo decoder 110 could utilize the SNR estimates generated by the SNR estimator 115 to decode the received signal. To implement this, however, it would be necessary to include a de-interleave unit 130. The de-interleave unit 130 would be employed to associate a given SNR estimate with a corresponding input metric. However, these time slot based SNR estimates are, as stated above, "fast", short-term SNR estimates, generally inaccurate, and significant fluctuation.

A more acceptable alternative for providing accurate SNR values to the turbo decoder 110, is to average "fast", short-term SNR values over a relatively long period of time. For example, the "fast", short-term SNR estimates produced by the SNR estimator 115 may be averaged to produce a long-term average SNR value for turbo decoding purposes. While this alternative would result in a more accurate SNR value, and one that is less susceptible to fluctuation, additional signal processing would be necessary.

Figure 2:
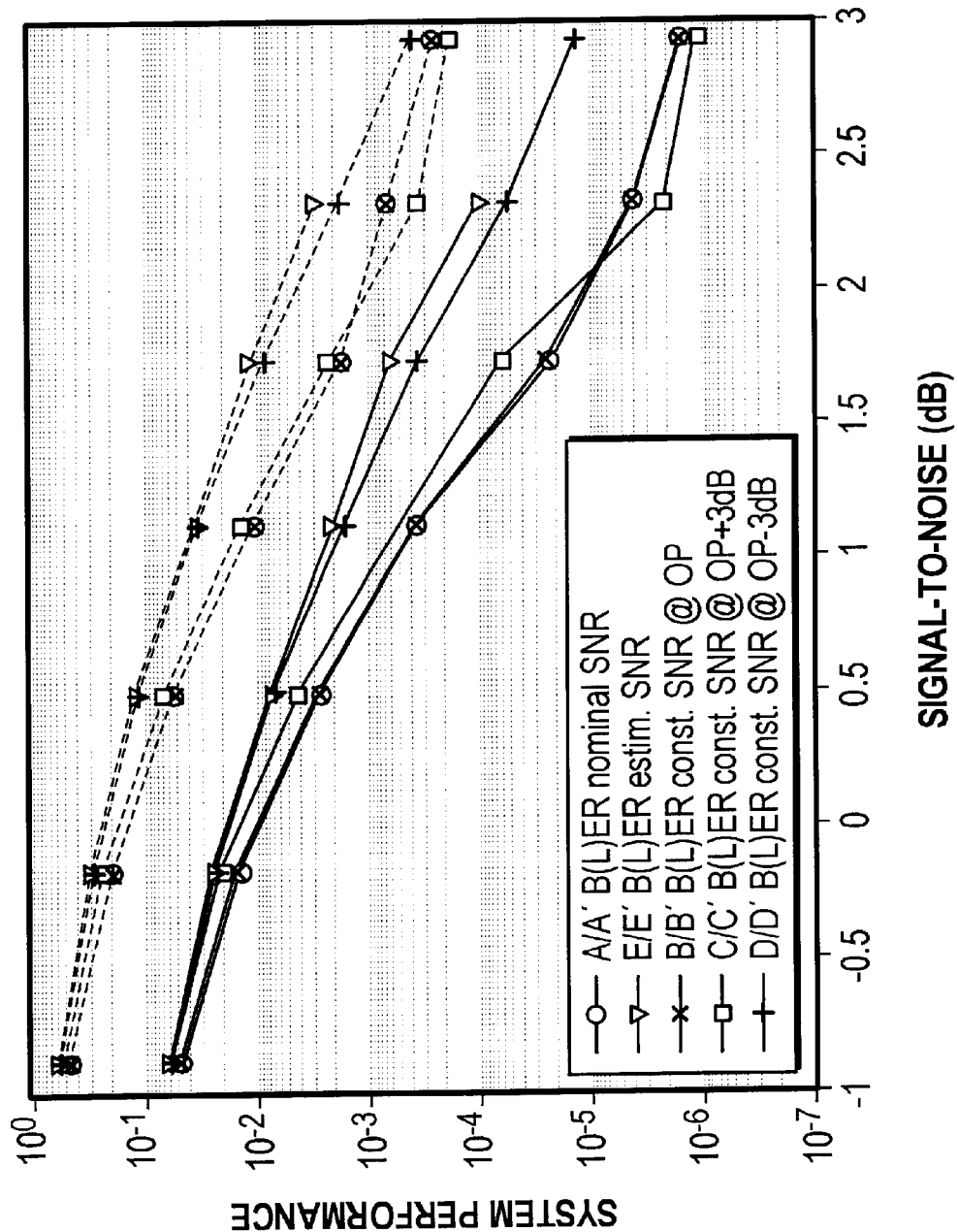
FIG. 2 depicts a graph which illustrates receiver performance as a function of the SNR estimation technique used to support the turbo decoding process.

The present invention overcomes the problems associated with the aforementioned alternative methods for providing SNR to the turbo decoder 110 by employing a more accurate, constant or quasi-constant SNR value, rather than a generally inaccurate SNR estimate that fluctuates in value from one radio frame to the next, or from one time slot to the next, or an SNR estimate that requires additional signal processing. Moreover, the constant or quasi-constant SNR value employed by the present invention is, preferably, an overestimation of the actual SNR rather than an underestimation of the actual SNR. The basis for employing an overestimated, constant SNR, rather than one which fluctuates from one radio frame to the next, is illustrated in FIG. 2. More specifically, the graph in FIG. 2 illustrates the expected link performance of a WCDMA receiver, in terms of bit error rate (BER) and block error rate (BLER), as a function of the SNR estimation used in decoding the received signal. As shown, the graph in FIG. 2 includes traces A–E (solid lines) and traces A'–E' (dashed lines), where traces A–E represent expected link performance, in terms of BER, at each of a number of simulated SNR values, and where traces A'–E' represent expected link performance, in terms of BLER, at each of a number of simulated SNR estimation values. From the graph, it can be seen that trace B and trace B', which correspond to the use of a constant, matched SNR estimation, most closely conform to trace A and A', which correspond to the use of a nominal SNR value. Of particular interest, however, is the fact that traces C and C', which represent the use of a constant, overestimated SNR value, produces better link performance than does the use of constant, underestimated SNR value, as illustrated by traces D and D', and significantly better performance than does the use of frame-based SNR estimates, as illustrated by traces E and E'.

Figure 3:
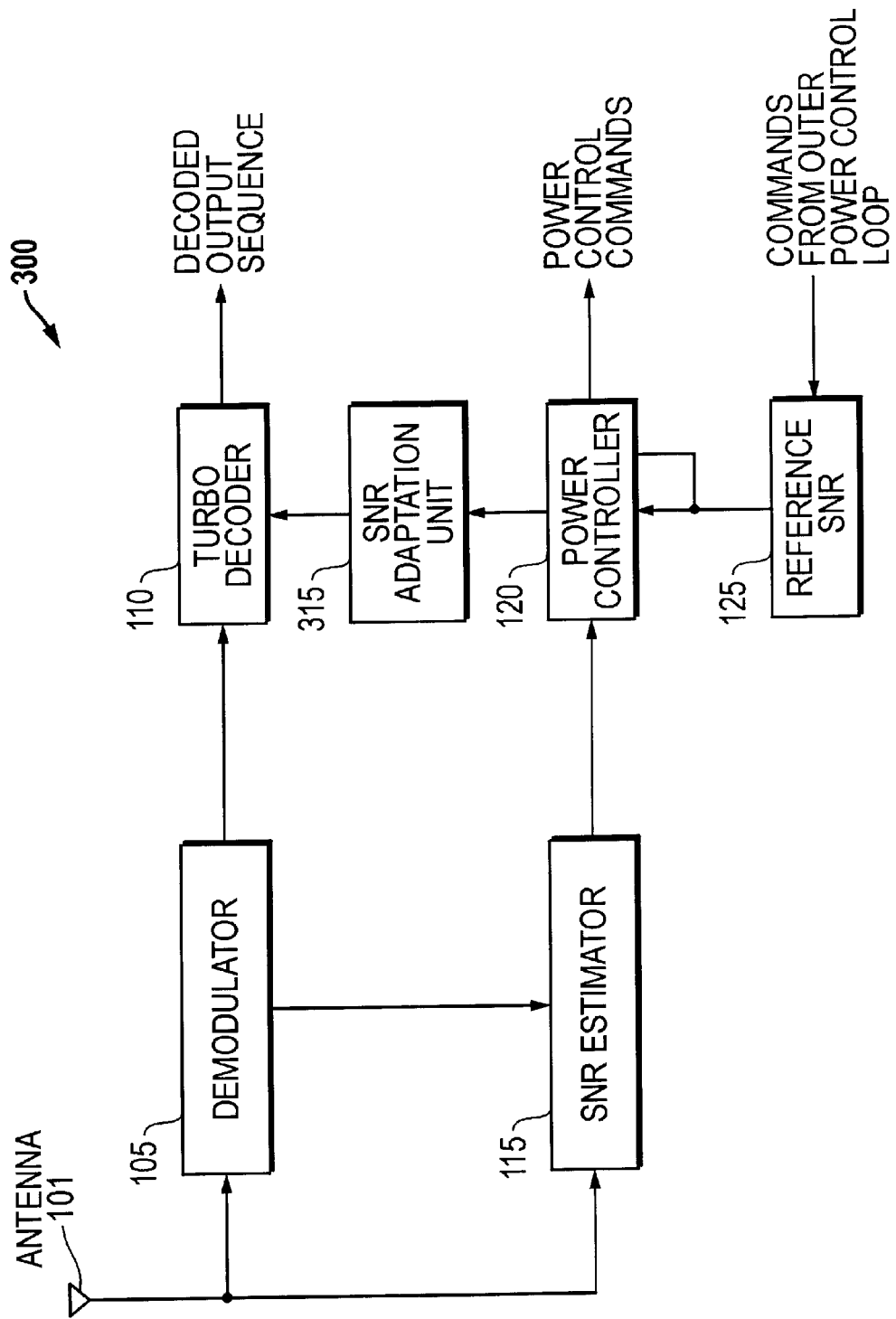
FIG. 3 illustrates the architecture associated with a receiver, such as a UMTS WCDMA receiver, in accordance with exemplary embodiments of the present invention.

FIG. 3 exemplifies the architecture of a receiver 300, such as a UMTS WCDMA receiver in accordance with exemplary embodiments of the present invention. As shown, receiver 300 includes, among other features, an antenna 101, a demodulation unit 105, a turbo decoder 110 and a SNR adaptation unit 315. The receiver 300 also includes a power control system which comprises a SNR estimator 115, a power controller 120 and a reference SNR module 125.

As in the conventional receiver architecture illustrated in FIG. 1, the received signal is forwarded from the antenna 101 to a demodulation unit 105 and a SNR estimator 115. The SNR estimator 115 uses the received signal to calculate a SNR estimate for each power control interval, as explained above. The SNR estimates generated by the SNR estimator 115 are then forwarded to the power controller 120, where they are compared to the reference SNR generated by the reference SNR module 125. The power controller 120 then generates the appropriate power control commands for the transmitter based on the comparison between the SNR estimates generated by the SNR estimator 115 and the reference SNR generated by the reference SNR module 125.

The demodulation unit 105, as in the conventional design, demodulates the received signal and, in doing so, generates scaled, decoder input metrics. As one skilled in the art will readily appreciate, the decoder input metrics are defined by the particular turbo decoder implementation employed. The decoder input metrics are then forwarded to the turbo decoder 110 for decoding.

Unlike the conventional receiver architecture illustrated in FIG. 1, the turbo decoder 110 in receiver 300 relies on a constant or quasi-constant SNR value to support the turbo decoding process. The constant or quasi-constant SNR value is, in accordance with a preferred embodiment of the present invention, derived from the reference SNR value generated by the reference SNR module 125. More specifically, the reference SNR, that is generated by the reference SNR module 125, is forwarded to the SNR adaptation unit 315. The SNR adaptation unit 315 then modifies the reference SNR generated by the reference SNR module 125 based on one or more factors including, but not necessarily limited to, the scaling factor associated with decoder input metrics generated by the demodulation unit 105, coding rate, power settings and processing gains (i.e., spreading factors used on the control information and data information portions of the transmitted signal). In addition, the SNR adaptation module 315 modifies the reference SNR such that the modified SNR value is an overestimation of SNR as compared to the reference SNR, for example, by a factor of 1–3 dB. The modified SNR is then forwarded from the SNR adaptation unit 315 to the turbo decoder 110, which uses the quasi-constant, modified SNR value to generate the decoded output sequence.

As stated, the modified SNR value is a quasi-constant SNR value. The modified SNR value is said to be quasi-constant because the reference SNR value generated by the reference SNR module 125 may, in fact, change periodically based on outer power control loop commands, wherein the outer power control loop may alter the reference SNR to achieve a new or different link performance operating point (e.g., a new or different BER or BLER). However, these changes are "slow" in comparison to the rate at which the time slot and frame-based SNR values change.

Further in accordance with a preferred embodiment of the present invention, the SNR adaptation unit 315 employs one or more embedded algorithms to handle the modification of the reference SNR value. As one skilled in the art will appreciate, these one or more algorithms may be implemented through software, firmware or a combination thereof, using conventional tools and programming practices.

A first of these one or more SNR modification algorithms contained in and executed by the SNR adaptation unit 315 may, for example, handle the task of modifying the reference SNR value such that the modified SNR value is a slightly overestimated value as compared to the reference SNR value. The algorithm might accomplish this task by adding an overestimation factor to the reference SNR value, wherein the overestimation factor may, as indicated above, range from 1–3 dB.

A second of these one or more SNR modification algorithms may handle the task of modifying the reference SNR value based on the modulation technique and/or the coding rate associated with the turbo coding scheme. For example, if the information sequence that is to be transmitted to the receiver is turbo encoded at a coding rate of one-third (⅓) and modulated in accordance with a Quadrature Phase Shift Keying (QPSK) scheme that combines two (2) encoded bits to form each symbol, the algorithm may adjust (e.g., multiply) the reference SNR value (in this case, the SNR expressed in terms of bit energy of the uncoded bit versus the noise density) by a modulation/coding rate factor of two-thirds (⅔). However, one skilled in the art will readily appreciate that in determining the modulation/coding rate factor, the percentage of overhead (e.g., the relative number of control bits) in the received signal should be taken into consideration.

Figure 4:
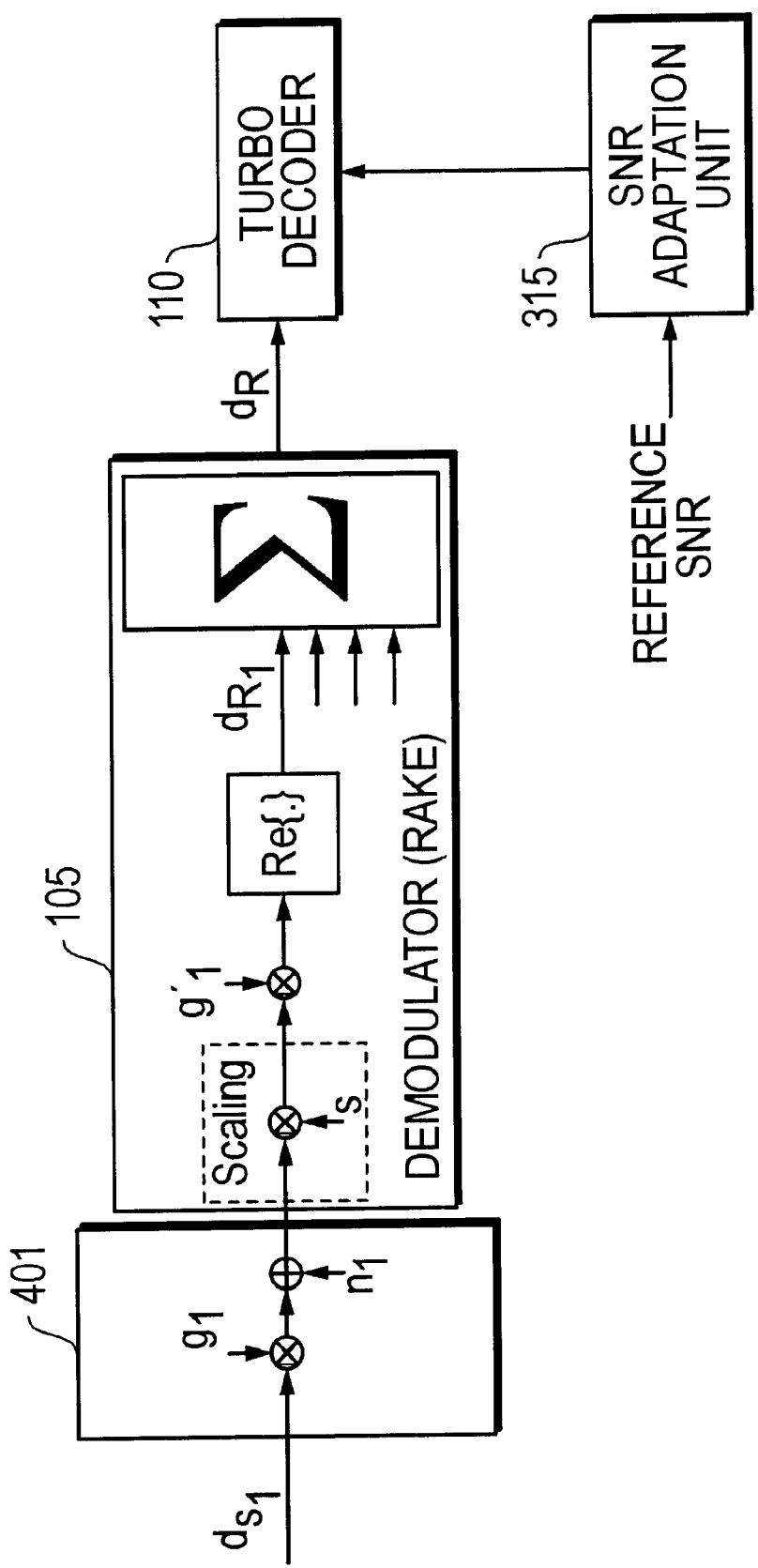
FIG. 4 illustrates the architecture associated with a receiver in accordance with exemplary embodiments of the present invention, as well as the scaling feature of a conventional demodulation unit.

Yet a third of these one or more SNR modification algorithms may be used to modify the reference SNR value to compensate for the scaling factor that is applied to the received signal by the demodulation unit 105. FIG. 4 illustrates a symbol-level model for the propagation channel 401, as well as the basic processing steps that are performed on a first ray (i.e., RAKE finger), at the symbol level, within a conventional WCDMA receiver demodulation unit, such as demodulation unit 105. As shown, the model of the propagation channel weights (e.g., multiplies) each data symbol $d_{S1}\{-1,+1\}$ by a complex channel weight $g_1$. Thereafter, a noise factor $n_1$ is added to the weighted bit value. The RAKE receiver in the demodulation unit 105 then scales the value by a scaling factor S. An estimated, complex conjugate channel weight $g'_1$ is then applied. The real component (Re{.}) of the resulting value $d_{R1}$ is then given by equation (1).

$$d_{R1}=Re\{g'_1{}^*S^*((d_{S1}{}^*g_1)+n_1)\} \quad (1)$$

The RAKE receiver then sums the resulting value $d_{R1}$ with the resulting values of the other rays, as indicated. The summed value $d_R$ is then forwarded to the turbo decoder 110, where the probability as to whether $d_R$ is equivalent to a logical "1" or a logical "0" is determined in accordance with equation (2), $$LLR=\log[(P_r(d_S=-1)/d_R)/(Pr(d_S=+1)/d_R]=d_R/((¼)^*S^*(SNR)^{-1}) \quad (2)$$

where LLR is the logarithmic likelihood ratio, which reflects the a priori probability that $d_S$ is a logical "1" or a logical "0".

It will be understood that in order to achieve optimum performance results from the turbo decoder 110, the decoder input metrics $d_R$, must be properly re-scaled. Of course, there are any number of alternative ways to accomplish this task. For instance, re-scaling can be accomplished in the demodulation unit 105. However, this is not always a viable option because the metrics produced by the RAKE receiver in the demodulation unit 105 may, for example, be forwarded to a Viterbi decoder for other services, which does not employ turbo decoding and, hence, does not require re-scaling. Re-scaling might also be accomplished within the turbo decoder. However, this alternative might not be practical because the added mathematical operations that would be needed to re-scale the input metrics would require significant modifications to the turbo decoder.

Another alternative is to accomplish re-scaling by adjusting the value of the reference SNR accordingly through the use of the SNR adaptation unit 315. However it should be noted that the data information may be transmitted at a different power level setting than the control information, particularly with regard to the uplink channel. Moreover, a different spreading factor (processing gain) may be applied to the data information as compared to the control information. Since the scaling factor S is typically a function of the power settings and the spreading factors, as indicated in equation (3), $$S=256^*(PS/(SF_C{}^*SF_D))^{1/2} \quad (3)$$

wherein PS represents the relative power level setting between the data information channel and the control information channel, $SF_C$ represents the spreading factor associated with the control information channel, $SF_D$ represents the spreading factor associated with the data information channel and the value '256' is a normalization factor, the SNR modification algorithm in the SNR adaptation unit 315 that is intended to modify the reference SNR value accordingly, should inherently take the power level settings and the spreading factors (i.e., processing gains) into consideration.

In an alternative embodiment of the present invention, the SNR adaptation unit 315 is employed to modify a quasi-constant SNR value that is, in fact, a long-term SNR value that has been generated by averaging "fast", short-term estimates over a period of time, as explained above, rather than a reference SNR value generated by the reference SNR module 125 in the power control loop. However, in accordance with this alternative embodiment, the SNR adaptation unit 315 would still be used to modify the long-term average SNR value using the various SNR modification algorithms described above.

The present invention has been described with reference to exemplary embodiments. However, it will be readily apparent to those skilled in the art that it is possible to embody the invention in specific forms other than those described above without departing from the spirit of the invention. The various aspects and exemplary embodiments are illustrative, and they should not be considered restrictive in any way. The scope of the invention is given by the appended claims, rather than the preceding description, and all variations and equivalents thereof which fall within the range of the claims are intended to be embraced therein.

What is claimed is:

1. In a telecommunications system, a receiver comprising:
    a demodulation unit capable of demodulating a received telecommunications signal and producing scaled, decode input metrics;
    a signal-to-noise ratio (SNR) adaptation unit capable of modifying a constant or quasi-constant SNR value as a function of at least one:
        (a) a factor ensuring overestimation of actual SNR,
        (b) a factor based on a modulation scheme that was applied to a transmitted signal,
        (c) a factor based on a coding rate that was applied to said transmitted signal,
        (d) a scaling factor associated with said decode input metrics,
        (e) power setting associated with control and data information contained in said transmitted signal, thereby generating a modified SNR value; and
    a turbo decoder connected to said demodulation unit and said SNR adaptation unit, wherein said turbo decoder decodes the received signal as a function of the decode input metrics and the modified SNR value.

2. The receiver of claim 1, wherein the constant or quasi-constant SNR value is a reference SNR value generated by a power control loop in said receiver.

3. The receiver of claim 1, wherein the constant or quasi-constant reference SNR value is derived by averaging a number of "fast", short-term SNR estimates.

4. The receiver of claim 3, wherein the "fast", short-term SNR estimates are time slot based SNR estimates.

5. The receiver of claim 3, wherein the "fast", short-term SNR estimates are frame based SNR estimates.

6. The receiver of claim 2, wherein the reference SNR value is generated by the power control loop as a function of a desired link performance operating point.

7. The receiver of claim 6, wherein the reference SNR value is a quasi-constant value that only changes when a different link performance operating point is desired.

8. The receiver of claim 6, wherein the link performance operating point is defined by a desired bit error rate.

9. The receiver of claim 6, wherein the link performance operating point is defined by a desired block error rate.

10. The receiver of claim 1, wherein said receiver is a wideband code division multiple access receiver.

11. A Universal Mobile Telecommunications System (UMTS) wideband code division multiple access (WCDMA) receiver comprising:
    a receive antenna for receiving a transmitted signal;
    a demodulation unit connected to said receive antenna, wherein said demodulation unit is capable of demodulating a received signal from said receive antenna and capable of generating therefrom scaled, decode input metrics;

a power control loop connected to said receive antenna, wherein said power control loop is capable of generating transmit power control commands as a function of a reference signal-to-noise (SNR) ratio and SNR estimates which are generated as a function of the received signal;

a SNR adaptation unit connected to said power control loop, wherein said SNR adaptation unit receives and modifies the reference SNR value; and a turbo decoder connected to said demodulation unit and said SNR adaptation unit, wherein said turbo decoder decodes the received signal as a function of the decode input metrics and the modified reference SNR value.

12. The WCDMA receiver of claim 11, wherein said power control loop comprises:

a reference SNR module, wherein said reference SNR module generates the reference SNR as a function of a desired level of link performance.

13. The WCDMA receiver of claim 12, wherein the reference SNR module changes the reference SNR only if a different level of link performance is desired.

14. The WCDMA receiver of claim 13, wherein the reference SNR module generates the reference SNR value based on commands received from an outer power control loop.

15. The WCDMA receiver of claim 11, wherein said SNR adaptation unit comprises:

an algorithm that modifies the reference SNR value as a function of a scaling factor associated with the decode input metrics.

16. The WCDMA receiver of claim 11, wherein said SNR adaptation unit comprises:

an algorithm that modifies the reference SNR value such that the modified reference SNR value is an overestimate of actual SNR.

17. The WCDMA receiver of claim 11, wherein said SNR adaptation unit comprises:

an algorithm that modifies the reference SNR value based on a coding rate.

18. The WCDMA receiver of claim 11, wherein said SNR adaptation unit comprises:

an algorithm that modifies the reference SNR value based on power settings associated with the control and data information contained in the transmitted signal.

19. The WCDMA receiver of claim 11, wherein said SNR adaptation unit comprises:

an algorithm that modifies the reference SNR value based on processing gains associated with the control and data information contained in the transmitted signal.

20. The WCDMA receiver of claim 11, wherein said SNR adaptation unit comprises:

an algorithm that modifies the reference SNR value based on a modulation scheme that was applied to the transmitted signal.

21. In a telecommunication system receiver, a method for decoding a received signal that was encoded in accordance with a turbo coding scheme, said method comprising the steps of:

demodulating the received signal so as to generate decode input metrics;

generating a constant or quasi-constant signal-to-noise ratio (SNR) value as a function of a desired link performance operating point, wherein the constant of qausi-constant SNR only changes if a different link performance operating point is desired;

generating a modified SNR value by modifying the constant or quasi-constant SNR value; and decoding the received signal as a function of the decode input metrics and the modified SNR.

22. The method of claim 21 wherein the step of generating a modified SNR value comprises:

modifying the constant or quasi-constant SNR value as a function of a scaling factor associated with the decode input metrics.

23. The method of claim 21 wherein the step of generating a modified SNR value comprises:

modifying the constant or quasi-constant SNR value such that the modified SNR value is an overestimate of actual SNR.

24. The method of claim 21 wherein the step of generating a modified SNR value comprises:

modifying the constant or quasi-constant SNR value based on a coding rate.

25. The method of claim 21 wherein the step of generating a modified SNR value comprises:

modifying the constant or quasi-constant SNR value based on a power setting associated with control and data information contained in a transmitted signal that corresponds to the received signal.

26. The method of claim 21 wherein the step of generating a modified SNR value comprises:

modifying the constant or quasi-constant SNR value based on a processing gain associated with control and data information contained in a transmitted signal that corresponds to the received signal.

27. The method of claim 21 wherein the step of generating a modified SNR value comprises:

modifying the constant or quasi-constant SNR value based on a modulation scheme.

28. The method of claim 21, wherein the constant or quasi-constant SNR value is generated by a power control loop in the receiver.

29. The method of claim 28, wherein said link performance operation point is defined by a desired bit error rate.

30. The method of claim 28, wherein said link performance operation point is defined by a desired block error rate.

31. The method of claim 21, wherein the receiver is a wideband code division multiple access (WCDMA) receiver.

* * * * *